United States Patent

Gossner et al.

[11] Patent Number: 6,067,247
[45] Date of Patent: May 23, 2000

[54] SRAM MEMORY CELL

[75] Inventors: Harald Gossner, München; Ignaz Eisele, Icking; Franz Wittmann; Rao Ramgopal, both of München, all of Germany

[73] Assignee: Siemens Aktiengesellschaft, Munich, Germany

[21] Appl. No.: 09/047,162

[22] Filed: Mar. 23, 1998

Related U.S. Application Data

[63] Continuation of application No. PCT/DE96/01745, Sep. 16, 1996.

[30] Foreign Application Priority Data

Sep. 21, 1995 [DE] Germany ............ 195 35 106

[51] Int. Cl.[7] .................................. G11C 11/41
[52] U.S. Cl. .............................. 365/154; 365/156
[58] Field of Search ...................... 365/154, 156

[56] References Cited

U.S. PATENT DOCUMENTS 5,600,589  2/1997  Ishigaki et al. .................. 365/154
5,657,290  8/1997  Churcher ......................... 365/205

FOREIGN PATENT DOCUMENTS 0 073 167 A1  3/1983  European Pat. Off. .
0 337 870 A1  10/1989  European Pat. Off. .

OTHER PUBLICATIONS

"Breakdown voltage of submicron MOSFET's in fully depleted SOI" (Kistler et al.), Microelectronics Manufacturing and Reliability, vol. 1802, 1992, pp. 202–212.

"FET memory systems" (Terman), IEEE Transactions on Magnetics, vol. MAG–6, No. 3, Sep. 1970, pp. 584–589;.

"On bistable behavior and open–base breakdown of bipolar transistors in the avalanche regime—modeling and application" (Reisch), IEEE Transactions on Electron Devices, vol. 39, No. 6, Jun. 1992, pp. 1398–1409.

"A static memory cell based on the negative resistance of the gate terminal of p–n–p–n devices" (Shulman), IEEE Journal of Solid State Circuits, vol. 29, No. 6, Jun. 1994, pp. 733–736;.

"A novel high speed, high density SRAM cell utilizing a bistable GeSi/Si tunnel diode" (Carns et al.), Proceedings of IEEE International Electron Devices Meeting, San Francisco, Dec. 1994, pp. 381–384;.

*Primary Examiner*—Andrew Q. Tran
*Attorney, Agent, or Firm*—Herbert L. Lerner; Laurence A. Greenberg

[57] ABSTRACT

A three-transistor SRAM memory cell includes a bistable field-effect transistor having a fully depleted floating channel region and a hysteretic gate voltage characteristic curve. The bistable field-effect transistor has a gate to be connected to a first bit line for the purpose of writing to the memory cell and a second channel terminal to be connected to a second bit line for the purpose of reading from the memory cell. The two bit lines can be identical. The connection between the bit lines and the bistable transistor can be effected through first and second respective transistors which are each controlled by a respective word line.

9 Claims, 1 Drawing Sheet

SRAM MEMORY CELL

CROSS-REFERENCE TO RELATED APPLICATION

This application is a continuation of International Application PCT/DE96/01745, filed Sep. 16, 1996, which designated the United States.

BACKGROUND OF THE INVENTION

1. Field of the Invention

The invention relates to a SRAM memory cell.

Memory cells of static random access memories (SRAM's) are known in which a flip-flop is used to store potential values that represent logic states. In that case, the flip-flop is made of four field-effect transistors. The memory cell also has two selection transistors, which are used for the reading in and reading out of the memory cell, and which have gates that are connected to a word line of the SRAM and connect the flip-flop to a bit line pair. Overall, then it is a six-transistor memory cell. It is also known to realize the flip-flop by using two field-effect transistors and two resistors, thereby producing a four-transistor memory cell.

2. Summary of the Invention

It is accordingly an object of the invention to provide a SRAM memory cell, which overcomes the hereinafore-mentioned disadvantages of the heretofore-known devices of this general type and which has a small space requirement.

With the foregoing and other objects in view there is provided, in accordance with the invention, a SRAM memory cell, comprising first and second potential terminals; first and second bit lines; a bistable field-effect transistor having first and second channel terminals and a gate, the first channel terminal connected to the first potential terminal; a first resistor having one terminal connected to the second channel terminal of the bistable field-effect transistor and another terminal, remote from the one terminal, connected to the second potential terminal; a first switch element for connecting the gate of the bistable field-effect transistor to the first bit line; and a second switch element for connecting the second channel terminal of the bistable field-effect transistor to the second bit line.

In this device, a bistable field-effect transistor is used instead of a flip-flop to store two logic states. One of the logic states corresponds to the switched-off bistable transistor and the other logic state corresponds to the switched-on bistable transistor.

A bistable field-effect transistor is to be understood in this case as a transistor which has a hysteretic current/gate voltage characteristic curve, with the result that it changes from the off state to the high-current state and vice versa only by the application of a suitable positive and a suitable negative threshold voltage. Gate voltage values between the values of the two threshold voltages do not effect a state of change. A bistable transistor can therefore be controlled, for example, by voltage pulses having a magnitude which only briefly exceeds the respective (positive or negative) threshold voltage. FIG. 2, which is explained below, illustrates a profile of the above-mentioned hysteresis function of a bistable field-effect transistor.

An article by N. Kistler, E. V. Ploeg, J. Woo and J. Plummer entitled "Breakdown Voltage of Submicron MOSFETs in Fully Depleted SOI" in Microelectronic Manufacturing and Reliability, Volume 1802 (1992), pages 202 ff. discloses a field-effect transistor which can be used according to the invention as a bistable field-effect transistor. That reference describes a fully depleted (that is to say virtually no free charge carriers are present in its channel region in the non-conducting state) lateral n-channel field-effect transistor which is constructed by using SOI (silicon on insulator) technology. Its channel region floats, that is to say it is not connected to a fixed potential.

A substrate on which the bistable transistor is disposed is often connected to a substrate potential. It is then necessary to insulate the channel region from the substrate in order to achieve floating of the channel region. In the cited prior art, that is done by applying SOI technology. However, the bistable transistor can also be disposed vertically on a semiconductor substrate in a different manner from the cited prior art, with the result that its channel region is insulated in a simple manner from the substrate. Such a vertical bistable transistor can be produced, for example, through the use of molecular beam epitaxy. Channel lengths of a few tens of nanometers can be achieved in that way. In experiments it was ascertained that a channel length of less than 100 nm, for example 85 nm, is particularly well suited for producing a vertical bistable transistor.

It is important for the production of a bistable transistor that its channel region is depleted in the off state. In the high-current state, that is to say when a gate voltage which exceeds the positive threshold voltage is applied, a breakdown of the transistor then occurs and charge carriers are liberated by collision ionization.

At channel lengths which are greater than 1 $\mu$m, it is possible to achieve sufficient depletion by using a channel region which has been contaminated a little by dopants. Shorter channel lengths permit channel regions having higher dopant concentrations. The depletion can be achieved, in particular, by widening the depletion layer of the blocked pn junction when the drain-source voltage is applied. At the short channel lengths, a sufficiently high electric field strength, which is required for the breakdown in the high-current state, is produced even at low drain-source voltages (for example <3 V).

The hysteresis effect described works as follows: if the drain-source voltage of the bistable field-effect transistor is above the already mentioned minimum value, which is determined by the technology used and the dimensions of the transistor, the bistable field-effect transistor can be changed from an off state to an on or high-current state by increasing its gate-source voltage to values above a positive threshold voltage, which can likewise be set. It remains in that high-current state even when the gate-source voltage is again reduced to values below the positive threshold voltage, provided that the minimum value of the drain-source voltage is not undershot. The transistor switches off again only upon application of a sufficiently negative gate-source voltage, which falls below a negative threshold voltage. (These explanations refer to bistable transistors of the n-channel type. However, the same is correspondingly true for p-channel transistors.)

The memory cell according to the invention functions in accordance with the following principle, according to which the hysteretic behavior of the bistable field-effect transistor is utilized: in order to write in a first logic value, for example a logic one, the bistable transistor is put into its high-current state by applying a suitable gate potential (at which the positive threshold voltage of the gate-source voltage is exceeded) through the use of a first bit line. This state is maintained even when the gate-source voltage once again achieves values below the positive threshold voltage. A second logic value, for example a logic zero, is written in by changing the bistable transistor from its high-current state to the off state by applying a sufficiently negative gate-source voltage (and undershooting the negative threshold voltage). The bistable transistor can thus be controlled by voltage pulses.

The memory cell is read out by connecting the second channel terminal to a second bit line. The latter is then charged either to the value of the first potential or that of the second potential corresponding to the state of the bistable transistor.

Since a prior art flip-flop having four transistors or two transistors and two resistors is replaced according to the invention by using just a single bistable field-effect transistor and one resistor for storage, it is possible to save at least one transistor and one resistor as compared with the known solutions, as a result of which the memory cell requires less space.

If a first and a second field-effect transistor are provided in each case for writing to and reading from the memory cell, the memory cell produced with the bistable field-effect transistor is a three-transistor memory cell instead of the known six-transistor or four-transistor memory cells.

In accordance with another feature of the invention, the gate of the bistable transistor is connected through a second resistor to a third potential which ensures that it has an undefined potential at no point in time. This achieves a reduction in the susceptibility to errors for the memory cell.

In accordance with a further feature of the invention, the second bit line can be precharged to the value of a second potential at the second potential terminal prior to a reading operation.

In accordance with an added feature of the invention, the first bit line has either of two potentials of different polarity during a writing operation.

In accordance with an additional feature of the invention, the two potentials of different polarity have the same magnitude as a first potential at the first potential terminal.

In accordance with yet another feature of the invention, there is provided a first word line, the first switch element being a first field-effect transistor having a gate connected to the first word line.

In accordance with yet a further feature of the invention, there is provided a second word line, the second switch element being a second field-effect transistor having a gate connected to the second word line.

In accordance with yet an added feature of the invention, the first word line coincides with the second word line.

In accordance with a concomitant feature of the invention, the first bit line coincides with the second bit line, in other words only one bit line is present. Both the writing to and the reading from the memory cell then take place through this line. The memory cell according to the invention can therefore have either two bit lines and a single word line for controlling the first and the second transistor or just a single bit line and a respective word line for controlling the first and the second transistor. Of course, it is also possible for two bit lines and two word lines to be present in each case.

Other features which are considered as characteristic for the invention are set forth in the appended claims.

Although the invention is illustrated and described herein as embodied in a SRAM memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
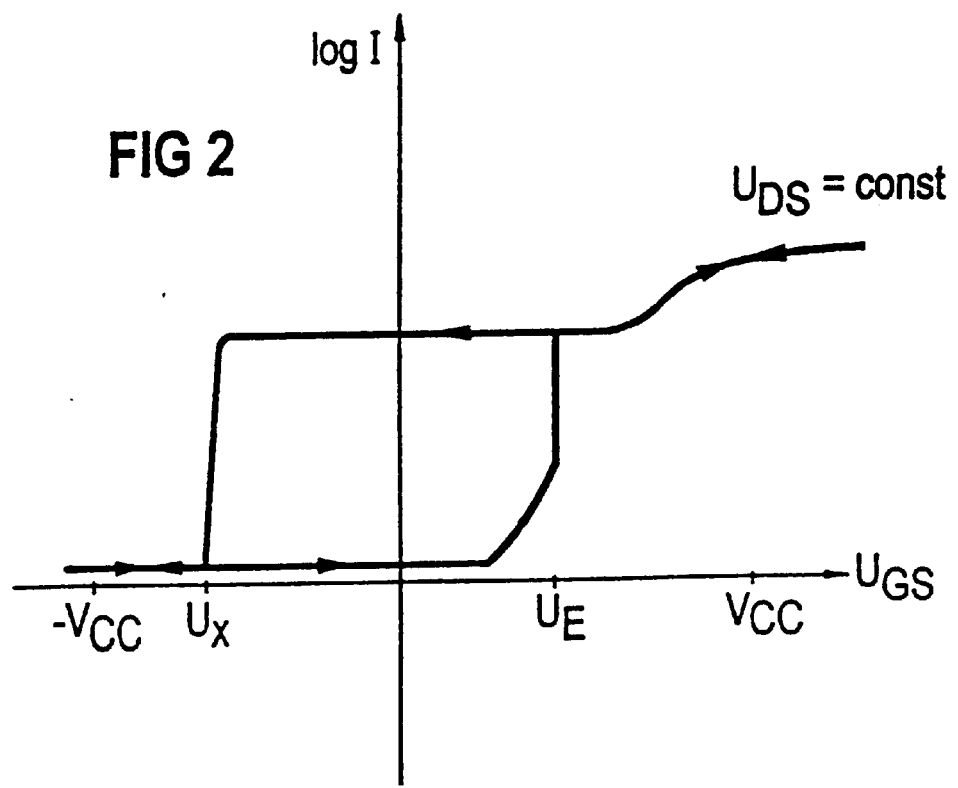
FIG. 2 is a graph showing a hysteretic characteristic curve of the bistable field-effect transistor of FIG. 1.

Referring now to the figures of the drawings in detail and first, particularly, to FIG. 2 thereof, there is seen a profile of a hysteresis function of a bistable field-effect transistor, in which a drain-source voltage $U_{DS}$ is assumed to be constant and greater than a specific minimum value at which the hysteretic behavior starts and which the voltage should not fall below during operation of the bistable transistor. A gate-source voltage $U_{GS}$ is plotted on the abscissa and a logarithm of a drain current I is plotted on the ordinate. A positive threshold voltage is designated by reference symbol $U_E$.

Figure 1:
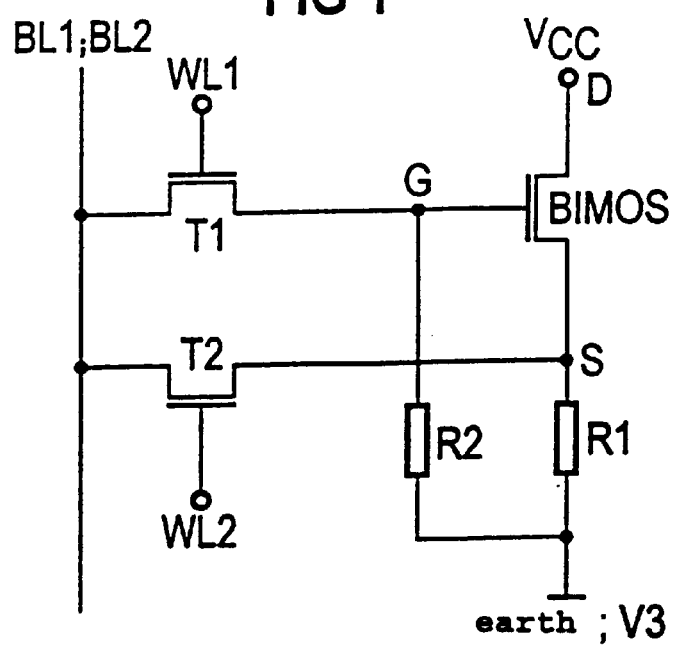
FIG. 1 is a schematic circuit diagram of an embodiment of a memory cell according to the invention.

Referring now to FIG. 1, there is seen a bistable field-effect transistor BIMOS, having a first channel terminal D which is connected to a terminal for a first potential VCC and a second channel terminal S that is connected through a first resistor R1 to a terminal for a second potential which is earth or ground.

In this exemplary embodiment of the invention, the bistable field-effect transistor BIMOS is of the n-channel type. It is assumed that the first potential VCC is greater than the second potential ground. For example, the two potentials VCC and ground may be supply potentials of an integrated circuit having the SRAM memory cell as a component part. The second potential ground may then be a reference potential, for example. Since it is assumed that the first potential VCC is greater than the second potential ground, in this exemplary embodiment the first channel terminal D of the bistable field-effect transistor BIMOS is its drain and the second channel terminal S is its source.

It is, of course, also possible to construct a memory cell using a bistable field-effect transistor BIMOS of the p-channel type, in which the first potential VCC is then to be selected to be less than the second potential ground.

A gate G of the bistable field-effect transistor BIMOS in FIG. 1 is connected through a first field-effect transistor T1 to a first bit line BL1. The first field-effect transistor T1 is of the n-channel type in this exemplary embodiment. The first field-effect transistor T1 can be controlled through a first word line WL1 which is connected to its gate.

The second channel terminal S of the bistable field-effect transistor BIMOS can be connected through a second field-effect transistor T2 to a second bit line BL2, which is identical to the first bit line BL1 in this exemplary embodiment. The second field-effect transistor T2 can be controlled through a second word line WL2 which is connected to its gate.

The first transistor T1 and the second transistor T2 may also be of the p-channel type, with the result that the potentials of the two word lines WL1, WL2 have to be changed correspondingly for the driving of the transistors.

A third potential V3, which is equal to the second potential ground in this exemplary embodiment, is present at the gate G of the bistable field-effect transistor BIMOS with the first and second transistors T1, T2 switched on. A second resistor R2 is used to ensure that the gate G does not float at any point in time, that is to say it never has an undefined potential. The value of the third potential V3 should be selected in such a way that when the first and second transistors T1, T2 are switched on, the gate-source voltage $U_{GS}$ of the bistable transistor BIMOS is not greater than its positive threshold voltage $U_E$ and is not less than a negative threshold voltage $U_X$ at which a change from the high-current state to the off state takes place, as is seen in FIG. 2. The second resistor R2 may also be dispensed with, but the memory cell may then be subjected to malfunctions due to the then floating gate G.

The memory cell illustrated in FIG. 1 functions in the following way:

1. Writing to the memory cell:

The potential at the second channel terminal S can assume two values, as will be explained below. The first value is the value of the first potential VCC minus at least the minimum value of the drain-source voltage $U_{DS}$. That minimum value has already been described above and is required for maintaining the high-current state. The second value is the value of the second potential ground. The determination of which of the two values it assumes depends on whether the bistable transistor BIMOS is in the off state or in the high-current state. In this case, the high-current state of the bistable transistor BIMOS corresponds, for example, to a stored logic one and the off state to a stored logic zero.

It is assumed that the second field-effect transistor T2 is switched off through the second word line WL2. In the illustrated exemplary embodiment, this takes place by virtue of the second word line WL2 having a potential which is the inverse of the first potential VCC, that is to say it has the same magnitude as the latter but an opposite sign. It will be assumed that the bistable field-effect transistor BIMOS is in its off state at the beginning (that is to say, for example, a logic zero is stored in the memory cell). The second potential ground is then present both at its gate G and at its second channel terminal S through the second R2 and the first R1 resistor, respectively.

If the first field-effect transistor T1 is then switched on (high-current state) by charging the first word line WL1 to the value of the first potential VCC, a new memory value (for example a logic one) can be written to the memory cell. For this purpose, before the first transistor T1 is switched on, the first bit line BL1 is charged to a potential (which may, for example, be equal to the first potential VCC) which charges the gate once the connection to the gate G of the bistable transistor BIMOS has been established, with the result that the positive threshold voltage $U_E$ of the bistable transistor BIMOS is exceeded.

Due to the characteristic properties of the bistable field-effect transistor BIMOS, the latter remains in the high-current state, that is to say in the on state, even when the first field effect transistor T1 is switched off again and the second potential ground is once again present at the gate G of the bistable field-effect transistor BIMOS through the second resistor R2. The only important criterion is that the drain-source voltage $U_{DS}$ never falls below the minimum value in the high-current state. This can be achieved by appropriate dimensioning of the bistable transistor BIMOS and of the first resistor R1.

A renewed change of the stored logic state is only possible if the bistable field-effect transistor BIMOS is switched off again. This takes place by bringing the first bit line BL1 to a negative potential which is below the negative hysteresis threshold $U_X$ of the bistable field-effect transistor BIMOS. If the first field-effect transistor T1 is then switched on, the potential of the gate G of the bistable field-effect transistor BIMOS virtually corresponds to that on the bit line BL. The bistable field-effect transistor BIMOS switches off and the second potential ground is present again at the second channel terminal S through the first resistor R1.

2. Read-out of the memory cell:

It is assumed that the first field-effect transistor T1 is switched off. The read-out takes place through the second field-effect transistor T2. If the latter is switched on, the second bit line BL2 is charged to the potential at the second channel terminal S. It is favorable in this case if the second bit line BL2 is precharged to the value of the second potential ground before the second field-effect transistor T2 is switched on. Specifically, on one hand, if the second potential ground is present at the second channel terminal S (the bistable transistor BIMOS is switched off), then it is not necessary to change the charge of the second bit line BL2 through the high-value first resistor R1. On the other hand, if the first potential VCC minus the drain-source voltage of the bistable transistor BIMOS (the latter is then switched on) is present at the second channel terminal S, then the second bit line BL2 is charged through the bistable field-effect transistor BIMOS and the second field-effect transistor T2. Although the potential at the second channel terminal S slightly decreases for a short time as a result, the bistable field-effect transistor BIMOS is consequently switched on even further (since its drain-source voltage $U_{DS}$ rises as a result), so that the changing of the charge of the second bit line BL2 is also accelerated.

With a suitable dimensioning (a value of the first resistor R1 in the teraohm range), on one hand the memory cell has only a small quiescent current even with the bistable transistor BIMOS switched on (the second field-effect transistor T2 is then switched off and there is no readout), whereas on the other hand, when the memory cell is read out, a high charging current can be achieved for the bit line BL and is supplied through the bistable transistor BIMOS. As described above, the second bit line BL2 can be precharged to the value of the second potential ground, with the result that a charging current never flows through the first resistor R1. On one hand, the resistor R1 must be dimensioned in such a way that there is a voltage drop between the first potential VCC and the second potential ground in the off state essentially across the bistable transistor BIMOS in the off state, with the result that virtually the second potential ground is present at the second channel terminal S. In the high-current state, on the other hand, the difference between the first potential VCC and the minimum value of the drain-source voltage should be present at the second channel terminal S.

The read-out through the second transistor T2 leaves the memory state of the memory cell, that is to say the state of the bistable transistor BIMOS (off or high-current state) unchanged. A change in the memory state can only be achieved through the first field-effect transistor T1 and the first bit line BL1.

The second resistor R2 is also to be selected to have the highest possible value in order to ensure that, with the first transistor Ti switched on, only a small current flows between the gate of the bistable field-effect transistor BIMOS and the second potential ground.

The invention provides an advantageous three-transistor SRAM memory cell. Tests with a vertical bistable transistor BIMOS have revealed that the latter remains in the high current and in the off state for long periods of time, while the second potential ground is present at its gate G. Memory times of more than four hours have been verified by experiments. The hysteretic gate voltage characteristic curve shown in FIG. 2 can be cyclically swept without change.

We claim:

1. A SRAM memory cell, comprising:
   first and second potential terminals;
   first and second bit lines;
   a bistable field-effect transistor having first and second channel terminals and a gate, the first channel terminal connected to said first potential terminal;
   a resistor having one terminal connected to the second channel terminal of said bistable field-effect transistor and another terminal connected to said second potential terminal;
   a first switch element connecting the gate of said bistable field-effect transistor to said first bit line; and
   a second switch element connecting the second channel terminal of said bistable field-effect transistor to said second bit line.

2. The SRAM memory cell according to claim 1, including another resistor connected between the gate of said bistable field-effect transistor and a third potential.

3. The SRAM memory cell according to claim 1, wherein said second bit line can be precharged to the value of a second potential at said second potential terminal prior to a reading operation.

4. The SRAM memory cell according to claim 1, wherein said first bit line has either of two potentials of different polarity during a writing operation.

5. The SRAM memory cell according to claim 4, wherein the two potentials of different polarity have the same magnitude as a first potential at said first potential terminal.

6. The SRAM memory cell according to claim 1, including a word line, said first switch element being a first field-effect transistor having a gate connected to said word line.

7. The SRAM memory cell according to claim 6, including another word line, said second switch element being a second field-effect transistor having a gate connected to said other word line.

8. The SRAM memory cell according to claim 7, wherein said word lines are identical.

9. The SRAM memory cell according to claim 1, wherein said first bit line is identical to said second bit line.

* * * * *